(12) United States Patent
Chae et al.

(10) Patent No.: US 7,196,015 B2
(45) Date of Patent: Mar. 27, 2007

(54) PATTERN FORMING METHOD AND ELECTRIC DEVICE FABRICATING METHOD USING THE SAME

(75) Inventors: Gee-Sung Chae, Incheon (KR); Gyoo-Chul Jo, Gyeonggi-Do (KR); Yong-Sup Hwang, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 313 days.

(21) Appl. No.: 10/669,467

(22) Filed: Sep. 25, 2003

(65) Prior Publication Data
US 2004/0115950 A1    Jun. 17, 2004

(30) Foreign Application Priority Data
Nov. 22, 2002    (KR)    ................ 10-2002-0073206

(51) Int. Cl.
*H01L 21/302*    (2006.01)

(52) U.S. Cl. .................. 438/706; 438/708; 438/712; 438/745; 216/57; 216/62

(58) Field of Classification Search ................ 438/706, 438/710, 712, 720, 745, 708, 709; 216/57, 216/62, 66
See application file for complete search history.

(56) References Cited

U.S. PATENT DOCUMENTS

| | | | | | |
|---|---|---|---|---|---|
| 4,288,283 | A | * | 9/1981 | Umezaki et al. | 216/22 |
| 4,842,677 | A | * | 6/1989 | Wojnarowski et al. | 216/65 |
| 6,004,831 | A | * | 12/1999 | Yamazaki et al. | 438/30 |
| 6,048,654 | A | * | 4/2000 | Nakayama et al. | 430/19 |
| 2001/0033023 | A1 | * | 10/2001 | Suguro | 257/751 |

* cited by examiner

*Primary Examiner*—Lan Vinh
(74) *Attorney, Agent, or Firm*—Morgan, Lewis & Bockius LLP

(57) ABSTRACT

A pattern forming method includes: forming an etching-subject layer on a substrate; forming a Ti layer on the etching-subject layer; forming a TiOx layer by irradiating light on a portion of the Ti layer using a mask; etching the Ti layer to form a TiOx pattern; etching the etching-subject layer using the TiOx pattern as a mask; and removing the TiOx pattern.

55 Claims, 13 Drawing Sheets

PATTERN FORMING METHOD AND ELECTRIC DEVICE FABRICATING METHOD USING THE SAME

The present invention claims the benefit of Korean Patent Application No. 2002-73206 filed in Korea on Nov. 22, 2002, which is hereby incorporated by reference.

BACKGROUND OF THE INVENTION

1. Field of the Invention

The present invention relates to a pattern forming method and, more particularly, to a pattern forming method and an electric device fabricating method using the same having a simple low cost process.

2. Description of the Background Art

In general, the pattern process of a semiconductor device is a critical factor in determining the performance and capacity of a device as well as in determining the spatial characteristics of the device. Efforts have been made to improve the performance of the semiconductor device. Research is actively ongoing especially to enhance the performance of the semiconductor device by forming a fine metal pattern (circuit pattern). A pattern forming process is not exclusively performed on the semiconductor device. A pattern forming process can also be used for a printed circuit board or a flat panel display device, such as a liquid crystal display device or a plasma display panel (PDP).

The most effective pattern forming process known so far is a process using a photoresist. FIGS. 1A to 1F illustrate sequential processes of a pattern forming method in accordance with the related art using a photoresist. As shown in FIG. 1A, photoresist, such as a photosensitive material, is deposited on a metal layer 3 formed on a substrate 1 made of an insulating material, such as glass or a semiconductor material, to form a photoresist layer 5.

Next, as shown in FIG. 1B, the photoresist layer 5 is baked. Subsequently, as shown in FIG. 1C, a mask 7 is positioned on the photoresist layer 5 and irradiated with a light, such as an ultraviolet light. In general, a photoresist can either be a positive photoresist or a negative photoresist. As an example, the case of a negative photoresist will be described for explanation purposes.

When the photoresist layer is irradiated with a light, the photoresist of the region, which is irradiated with the light, is changed in its chemical structure, so that when a developer is applied thereto, the photoresist of the region, which is not irradiated with the light, is removed to form a photoresist pattern 5a, as shown in FIG. 1D. And then, as shown in FIG. 1E, after an etching solution is applied to the photoresist pattern 5a and the metal layer 3, a metal pattern 3a under the photoresist pattern 5a remains because the photoresist pattern 5a blocks the etching solution from etching a portion of the metal layer 3 under the photoresist pattern 5a. Thereafter, as shown in FIG. 1F, when the photoresist pattern 5a is removed by applying a stripper, only the metal pattern 3a remains on the substrate 1.

The metal pattern forming method using a photoresist has several problems. First, the fabrication process is complicated. For example, the photoresist pattern is formed through photoresist deposition, baking, exposing and developing processes. To bake the photoresist, the photoresist needs to undergo a soft baking process carried out at a specific temperature and a hard baking process carried out at a higher temperature than the soft baking temperature, which makes the process more complicated.

Second, fabrication costs are expensive. Usually, in the fabrication of electronic devices including a plurality of patterns (or electrodes), such as a transistor, one photoresist process forms one pattern and another photoresist process forms another pattern. An expensive photoresist process line is required for each patterning process. Thus, fabrication costs of an electronic device increase for every patterning process required. For example, in the fabrication of a thin film transistor, the expense of the patterning process using a photoresist accounts for about 40~45% of the total expense.

Third, patterning with a photoresist can cause environmental pollution if not properly treated. In general, photoresist is deposited by spin coating, which means that a lot of photoresist is discarded during deposition. Discarding of photoresist also increases fabrications costs of electronic devices in terms of material costs.

Fourth, resulting electronic products may be defective. For example, the thickness of a photoresist layer applied by spin coating can not be accurately controlled. A resultant photoresist layer may have a non-uniform thickness. Thus, non-stripped photoresist may end up remaining on the surface of a pattern after a patterning process such that a defective electronic device results.

SUMMARY OF THE INVENTION

Accordingly, the present invention is directed to a pattern forming method and an electric device fabricating method using the same that substantially obviate one or more of the problems due to limitations and disadvantages of the related art.

An object of the present invention is to provide a reliable and cost effective pattern forming method.

Another object of the present invention is to provide a method for fabricating a liquid crystal display device having a simplified fabrication process and reduced fabrication costs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a pattern forming method including: forming an etching-subject layer on a substrate; forming a Ti layer on the etching-subject layer; forming a TiOx layer by irradiating light on a portion of the Ti layer using a mask; etching the Ti layer to form a TiOx pattern; etching the etching-subject layer using the TiOx pattern as a mask; and removing the TiOx pattern.

In another aspect, a pattern forming method includes: forming an etching-subject layer on a substrate; forming a Ti layer on the etching-subject layer; oxidizing a portion of the Ti layer to form an TiOx pattern; etching the etching-subject layer using the TiOx pattern as a mask; and removing the TiOx pattern.

In another aspect, a pattern forming method includes: forming an etching-subject layer on a substrate; forming a $TiO_2$ layer including a first region and a second region on the etching-subject layer; irradiating light onto the first region of the $TiO_2$ layer using a mask; etching the second region of the $TiO_2$ layer; etching the etching-subject layer using the first region of the $TiO_2$ layer as a mask; and removing the first region of the $TiO_2$ layer.

In another aspect, a pattern forming method includes: forming an etching-subject layer on a substrate; forming a $TiO_x$ layer on the etching-subject layer; changing a surface of the $TiO_x$ layer from hydrophobic to hydrophilic such that the $TiO_x$ layer has a hydrophobic surface and a hydrophilic surface; etching a portion of $TiO_2$ layer having a hydrophobic surface to form a hydrophilic $TiO_x$ pattern; etching the etching-subject layer using the hydrophilic $TiO_2$ pattern as a mask; and removing the hydrophilic $TiO_x$ pattern.

In another aspect, a pattern forming method includes: providing an etching-subject layer; forming a metal layer on the etching-subject layer; oxidizing a portion of the metal layer to form a metallic oxide layer portion and non-oxidized metal layer portion; removing the non-oxidized metal layer portion using a first etching means; etching the etching-subject layer using the metallic oxide layer as a mask; and etching the metallic oxide layer using a second etching means.

In another aspect, a method for fabricating a liquid crystal display device includes: providing a substrate; forming a gate electrode on the substrate using a first metal masking layer; depositing a gate insulating layer over the substrate; forming a semiconductor layer on the gate insulating layer using a second metal masking layer; forming source/drain electrodes on the semiconductor layer using a third metal masking layer as a mask; forming a passivation layer over the substrate; and depositing a pixel electrode on the passivation layer.

In another aspect, a method for fabricating a semiconductor device includes: depositing an insulating layer on a semiconductor substrate; forming a metal layer on the insulating layer; forming a Ti layer on the metal layer; irradiating light onto a portion of the second metal masking layer using a mask to form a TiOx masking layer portion and a Ti masking layer portion; etching TiOx masking layer portion to form a TiOx pattern; etching the metal layer using the TiOx pattern as a mask and removing the TiOx pattern to form a gate electrode; and introducing ions to the semiconductor substrate to form source/drain regions.

In another aspect, a method for fabricating a semiconductor device includes: depositing an insulating layer on a semiconductor substrate; forming a metal layer on the insulating layer; forming a $TiO_2$ layer on the metal layer; irradiating light onto a portion of the $TiO_2$ layer to change a surface of the $TiO_2$ layer from hydrophobic to hydrophilic such that the $TiO_2$ layer has a hydrophobic surface and a hydrophilic surface; etching a portion of $TiO_2$ layer having a hydrophobic surface to form a hydrophilic $TiO_2$ pattern; etching the metal layer using the hydrophilic $TiO_2$ pattern as a mask to form a gate electrode; and introducing ions to the semiconductor substrate to form source/drain regions.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 1A:
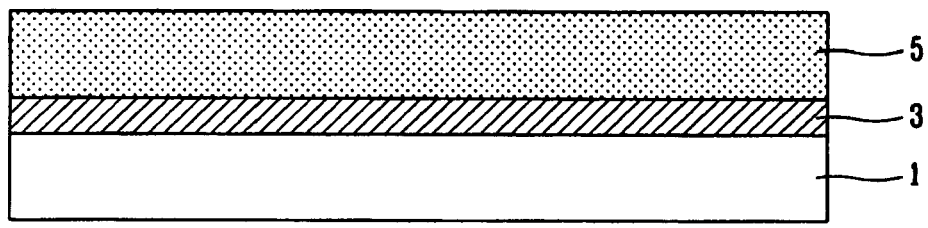
FIGS. 1A to 1F illustrate sequential processes of a pattern forming method in accordance with the related art using a photoresist.
Figure 1B:
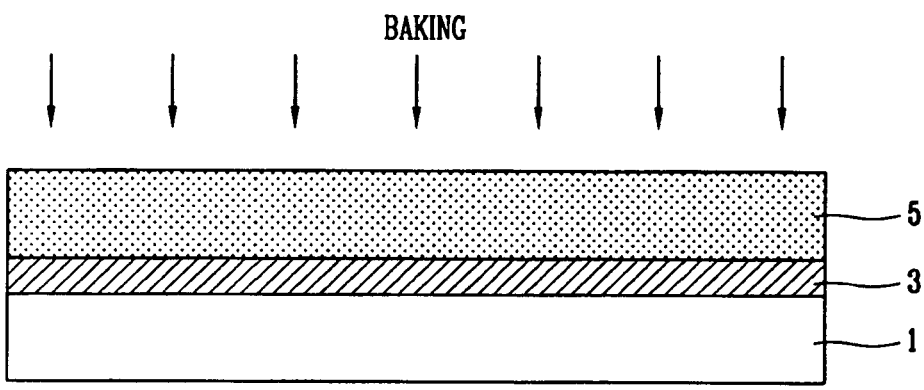
Figure 1C:
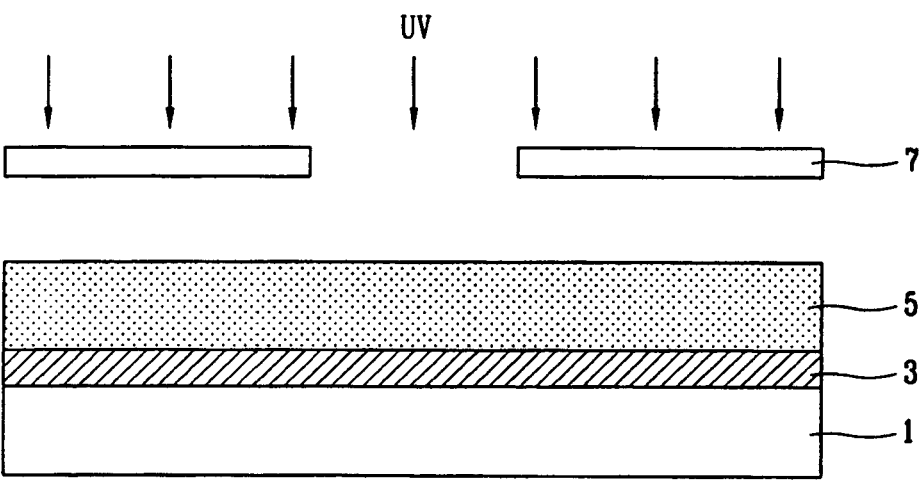
Figure 1D:
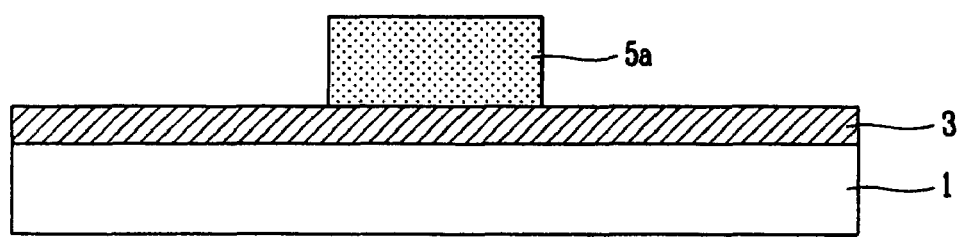
Figure 1E:
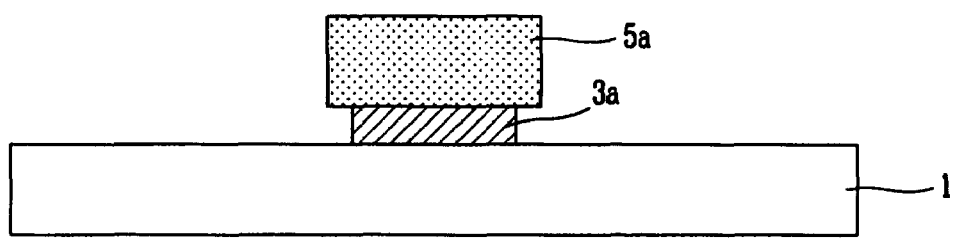
Figure 1F:
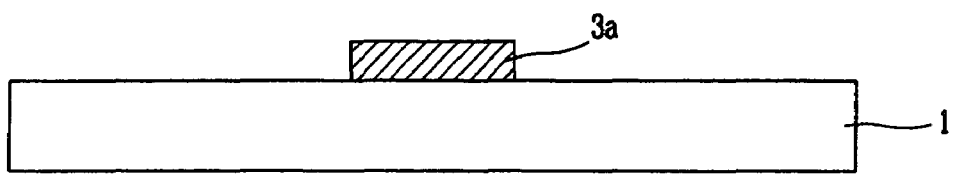

Reference will now be made in detail to the preferred embodiments of the present invention, examples of which are illustrated in the accompanying drawings.

In embodiments of the present invention, a pattern is formed with a metal. That is, instead of the photoresist as in the related art, metal is used as a material for blocking an etchant from an etching-subject layer while patterning the etching-subject layer. In other words, after a metal pattern is formed by etching a metal formed on the etching-subject layer, etching is performed by using the metal pattern as a mask to pattern the etching-subject layer.

In embodiments of the present invention, a portion of the metal is oxidized to form a metallic oxide. The metallic oxide is formed by applying energy to the metal in an open atmosphere or in an oxygen atmosphere. The metal and the metallic oxide of the metal have different etching selection ratios. Further, the metal and the metallic oxide of the metal can be developed differently as well as etched differentially by different gases. Thus, a suitable developer or etching gas to etch either the metal or the metallic oxide of the metal can be used to selectively etch. In addition, the characteristics of the metallic oxide's surface can be changed from hydrophobic to hydrophillic when light is irradiated onto the metallic oxide's surface such that a desired pattern can be obtained by selecting a suitable developer.

Ti can be used as the metal. Ti is stable in air but turns into TiOx when heated in an air or oxygen atmosphere. Because Ti and TiOx have different etching ratios, when a portion of Ti is oxidized to form TiOx and a specific developer is applied thereto, a TiOx pattern can be formed.

When light with a specific wavelength is irradiated on the TiOx, the surface of the TiOx changes from hydrophobic to hydrophilic. Accordingly, a specific TiOx pattern can be obtained by using the difference between the hydrophillic and hydrophobic surface characteristics. Subsequently, the specific TiOx pattern can be used to form a desired pattern.

Pattern forming methods in accordance with embodiments of the present invention can also be used to pattern various thin films using Ti or TiOx as a masking layer. For example, various electrodes, lines, insulating patterns, semiconductor patterns, pixel electrodes or the like of the semiconductor device and the display device can be fabricated through the pattern forming method in accordance with embodiments of the present invention. The term "masking layer" refers to a layer that masks a portion of the etching-subject layer with Ti or TiOx.

The metal pattern forming method in accordance with embodiments of the present invention will now be described with reference to the accompanying drawings. FIGS. 2A to 2F illustrate sequential processes of a pattern forming method in accordance with one embodiment of the present invention. Patterning of a metal layer will be used as an example. Of course, other patterns, such as semiconductor patterns and insulating patterns, can also be formed with the metal pattern forming method in accordance with embodiments of the present invention.

Figure 2A:
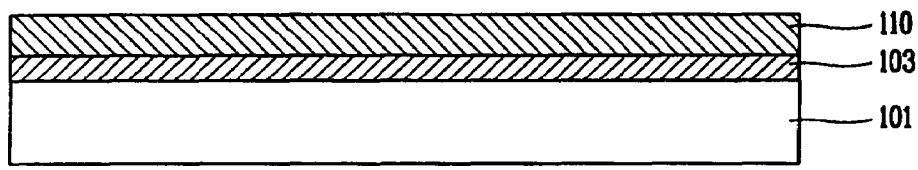
FIGS. 2A to 2F illustrate sequential processes of a pattern forming method in accordance with one embodiment of the present invention.

As shown in FIG. 2A, a metal layer 103, such as aluminum, is formed on the substrate 101. A Ti layer 110 can be formed on the metal layer 103. The Ti layer 110 can be formed through evaporation or sputtering process (that is, in the same condition and in the same atmosphere) with the same equipment as the metal layer 103.

Figure 2B:
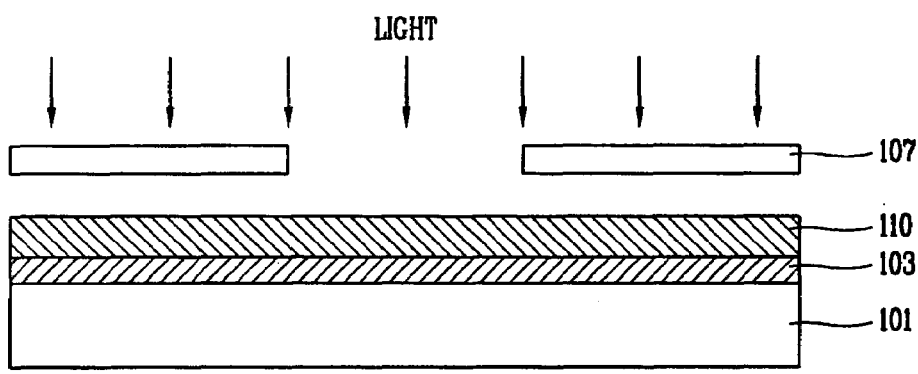

Subsequently, as shown in FIG. 2B, light, such as ultraviolet or a laser, irradiates a region where a metal pattern is to be formed with a mask 107. The irradiation of light applies energy to the Ti layer 110. At this time, the irradiation of the ultraviolet ray or laser is made in an air or oxygen atmosphere to oxidize the Ti layer 110. At first, the Ti layer is oxidized at the surface and then entirely oxidized as time elapses, to form a TiOx layer 110a.

Figure 2C:
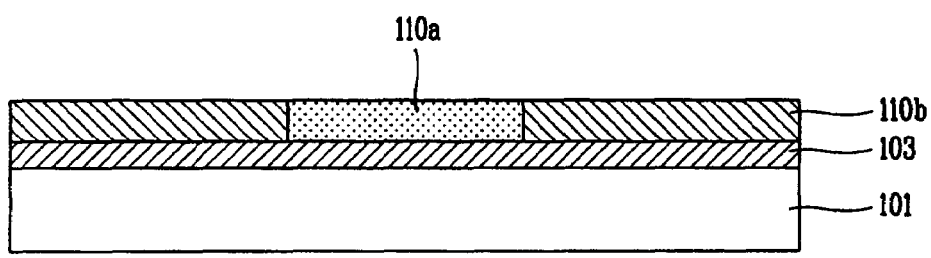
Figure 2D:
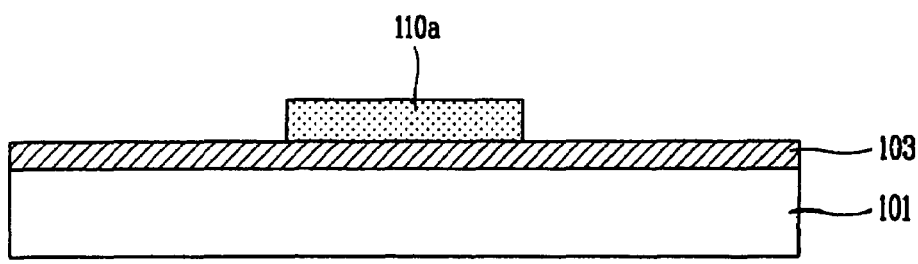
Figure 2E:
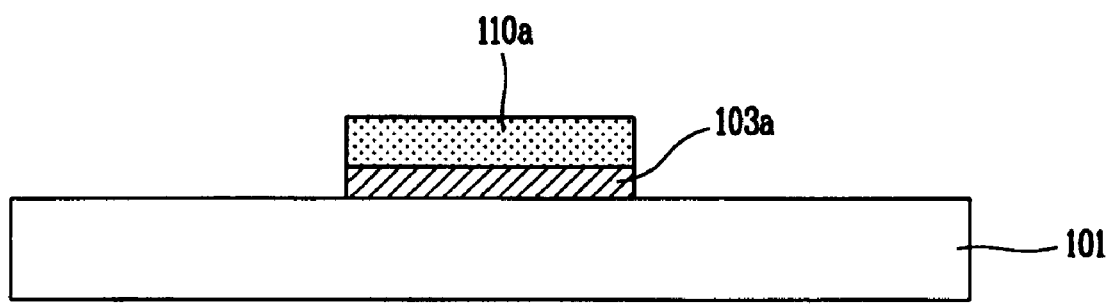

As shown in FIG. 2C, the TiOx layer 110a, which will be subsequently used to pattern the metal 103, is surrounded by non-oxidized Ti layer 110b. Thereafter, as shown in FIG. 2D, the Ti layer 110b is removed to form a particular shaped TiOx layer 110a, that is, a TiOx pattern. The Ti layer 110b is removed through a wet etching process or a dry etching process. In the wet etching process, an acid, such as HF, is commonly used as a developer. Hf does not react with the TiOx but does react with Ti to form TiF that is thus removed. Thus, by using an HF acid, only Ti is etched such that only the TiOx pattern 110a remains on the metal layer 103, as shown in FIG. 2D. Acids other than HF can be used, except for $H_2SO_4$ because Ti does not react with the $SO_4$ ion. In the case of a dry etching process, the etching rate for TiOx with $Cl_2$ gas or $Cl_2$-mixed gas, such as $CF_4/Cl_2/O_2$, is much lower compared to the etching rate for Ti with the same $Cl_2$ gas or $Cl_2$-mixed gas that is commonly used as an etching gas. Thus, when the metal layer 103 is etched through a wet etching process or dry etching process, the TiOx pattern 110a blocks an etching solution (in the case of the wet etching process) or the etching gas (in the case of the dry etching process), so that metal that is not under the TiOx pattern 110a is removed, as shown in FIG. 2E.

Figure 2F:
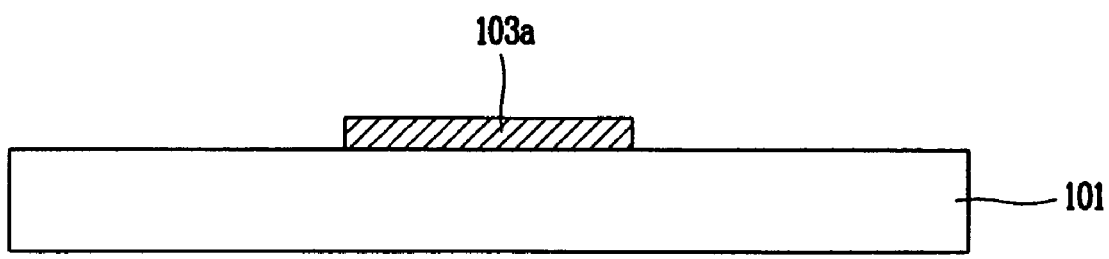

Subsequently, as shown in FIG. 2F, the TiOx pattern 110a is etched such that a desired metal pattern 103a is exposed. The TiOx pattern 110a can be etched either through a wet etching process or a dry etching process. In the case of wet etching process, $H_2SO_4$ is used because the $SO_4$ ion of the $H_2SO_4$ reacts with TiOx such that the TiOx is removed to expose the desired pattern. In the case of the drying etching process, $Cl_2/N_2$ gas or $CF_4/Cl_2$ gas is used to expose the desired pattern.

Figure 3A:
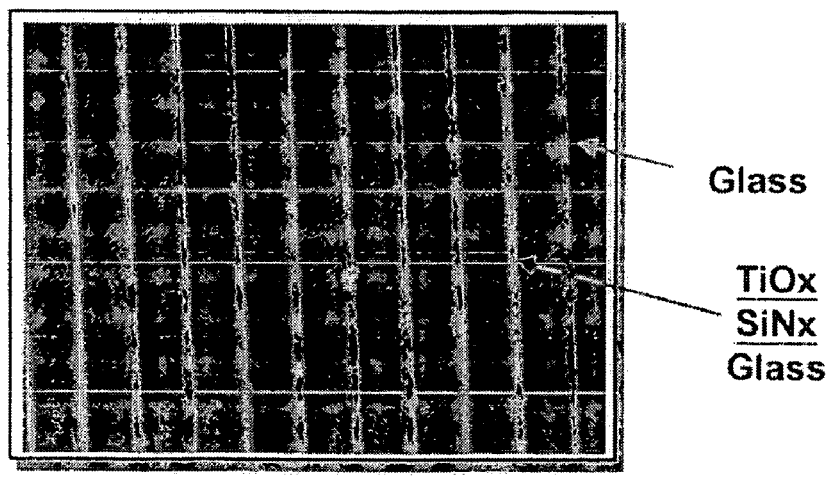
FIGS. 3A to 3C show an enlarged view of an actual pattern fabricated in accordance with an embodiment of the present invention.
Figure 3B:
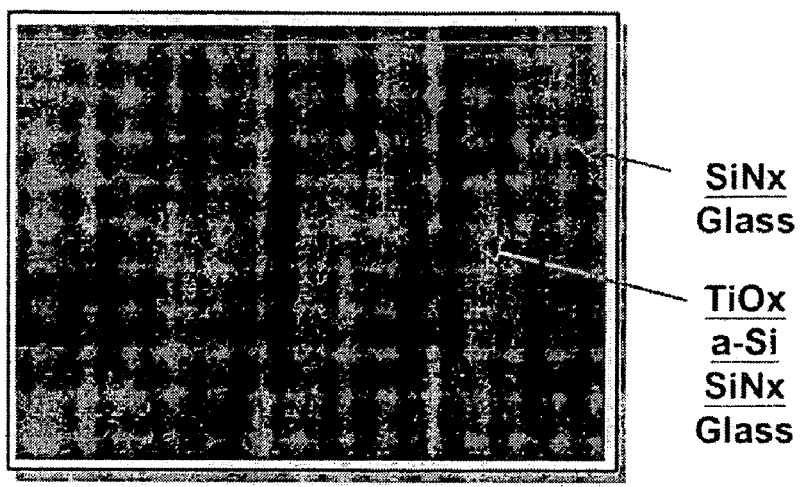
Figure 3C:
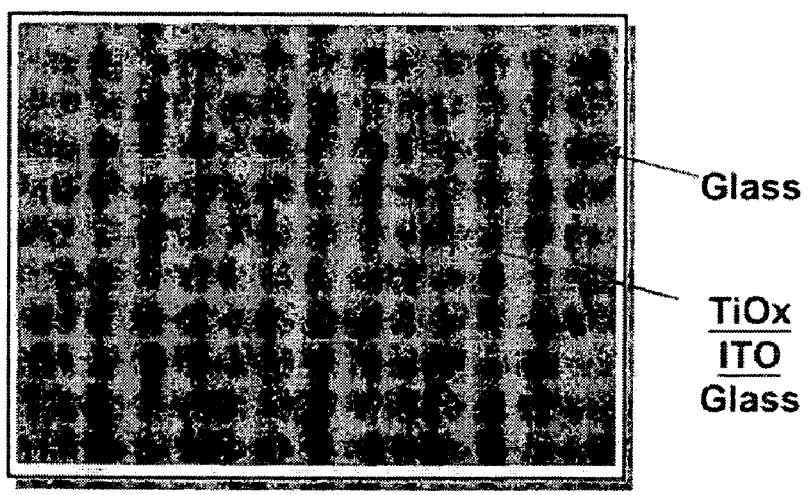

FIGS. 3A to 3C show enlarged views of an actual patterns fabricated in accordance with embodiments of the present invention. Each of the photos in FIGS. 3A to 3C show a TiOx mask for patterning different types of etching-subject pattern. In particular, FIG. 3A is a photo showing a TiOx mask on an insulating layer, such as SiNx, on a substrate. FIG. 3B is a photo showing a TiOx mask on a-Si layer, which is formed on an insulating layer, such as SiNx, on a substrate. FIG. 3C is a photo showing a TiOx mask on an ITO (Indium Tin Oxide) layer formed on a substrate. As shown in the photos, various masks can be respectively used to pattern insulating, semiconductor, metal layers and the like through the method in accordance with embodiments of the present invention.

Figure 4A:
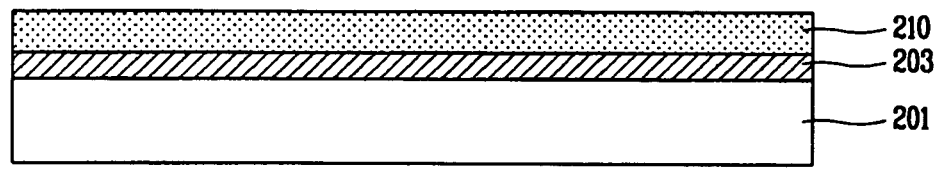
FIGS. 4A to 4F illustrate sequential processes of a pattern forming method in accordance with another embodiment of the present invention.

In addition, a pattern can be formed using the a hydrophobic or a hydrophilic characteristic of a metal oxide, such as TiOx, as shown in FIGS. 4A to 4F. Although, a method for patterning a metal will now be described as an example, a TiOx metallic oxide can be used to pattern various types of materials. As shown in FIG. 4A, a metal layer 203, such as aluminum, is deposited on a substrate 201 made of an insulation material, such as glass. A TiOx, such as $TiO_2$, is deposited on the metal layer 203 to form a $TiO_2$ layer 210. The $TiO_2$ layer 210 can be formed directly on the metal layer 203 by evaporation or sputtering, or can be formed by depositing Ti on the metal layer 203 and applying heat or irradiating light to oxidize it.

Figure 4B:
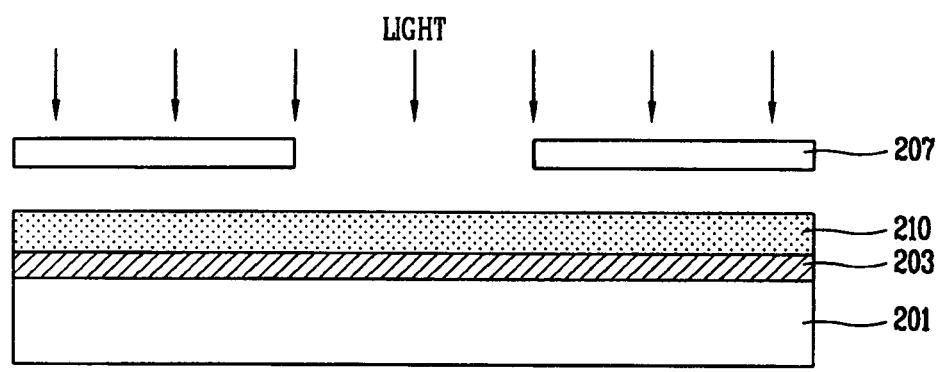

Thereafter, as shown in FIG. 4B, a region other than a region where a pattern is to be formed is blocked with a mask 207, and light, such as ultraviolet ray or laser, is irradiated onto the mask 207. Irradiation of ultraviolet ray or laser makes the surface of $TiO_2$ layer become hydrophilic. In general, $TiO_2$ is known as a photocatalytic material and has a hydrophobic characteristic. When ultraviolet ray and laser is irradiated onto the $TiO_2$ layer, OH radicals are generated at its surface such that the surface is changed to have a hydrophilic characteristic.

Figure 5:
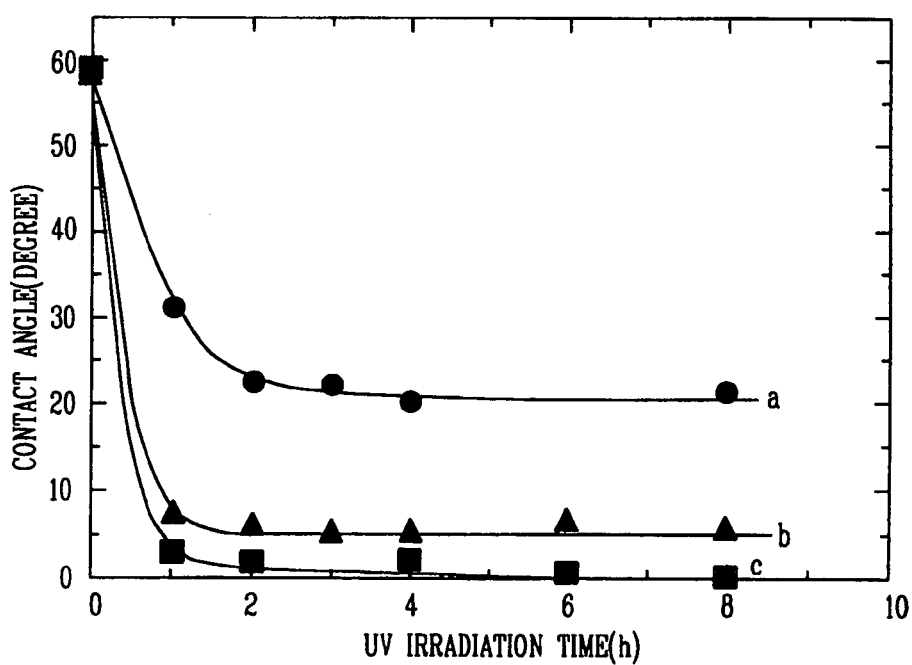
FIG. 5 is a graph showing a relation between ultraviolet ray irradiation time and a contact angle.

FIG. 5 is a graph showing a relation between ultraviolet ray irradiation time and a contact angle. FIG. 5 shows a curve 'a' for a $TiO_2$ layer formed through sputtering, a curve 'b' for a $TiO_2$ layer formed through PECVD (Plasma Enhanced Chemical Vapor Deposition) method, and a curve 'c' for a $TiO_2$ layer formed through the PECVD method at a temperature of 100° C. The contact angle refers to an angle made when a liquid has a thermodynamical balance on the surface of a solid. The contact angle is an indicator of wettability, that is, the hydrophilic characteristic of the surface of the solid. The stronger the hydrophilic characteristic is, the smaller the angle is. FIG. 5 shows that when an ultraviolet ray irradiates the $TiO_2$ layer, the contact angle is reduced. Further, when ultraviolet ray is irradiated onto the $TiO_2$ layer for more than one hour, the contact angle nears "0", which means that it has a strong hydrophilic characteristic.

Figure 4C:
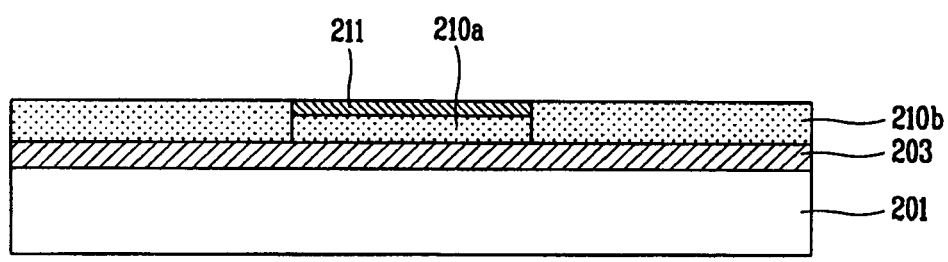
Figure 4D:
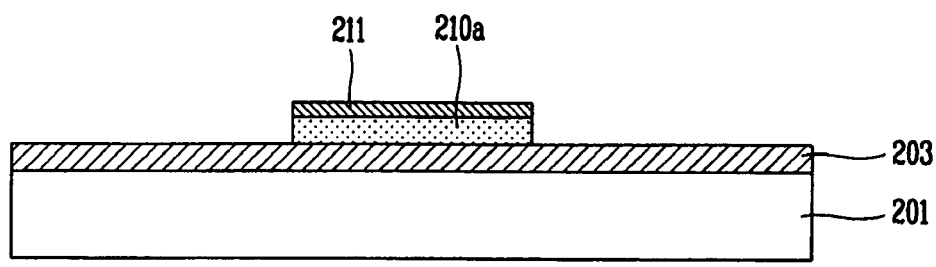

As shown in FIG. 4C, through irradiation of ultraviolet ray or laser, the $TiO_2$ layer 211 is divided into a first $TiO_2$ layer 210a with a hydrophilic surface and a second $TiO_2$ layer 210b with a hydrophobic surface. As mentioned above, when $H_2SO_4$ or an alkali based etchant is applied to the $TiO_2$ layer with different surface characteristics, the OH radical of the first $TiO_2$ layer 210a having the hydrophilic characteristic does not combine with $SO_4$ ion of $H_2SO_4$. That is, the OH radical protects the surface of $TiO_2$ layer 211 having the hydrophilic characteristic. Accordingly, only the second $TiO_2$ layer 210b with the hydrophobic characteristic is removed by the etchant. Thus, the $TiO_2$ layer 211 having the hydrophilic characteristic and the first $TiO_2$ layer 210a with the hydrophobic characteristic, that is, a desired $TiO_2$ pattern, remain on the metal layer 203, as shown in FIG. 4D.

Figure 4E:
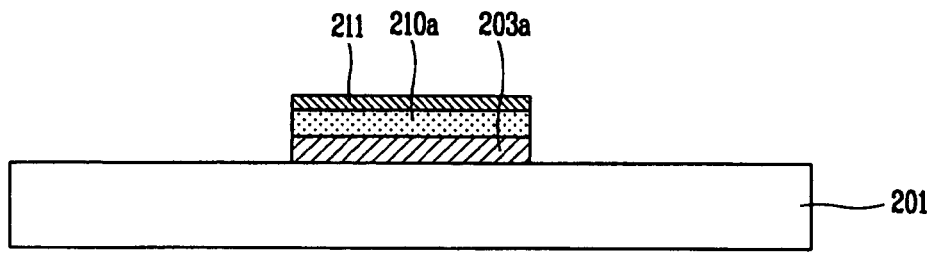
Figure 4F:
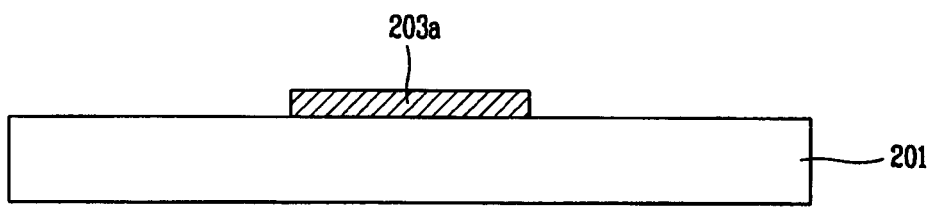

Subsequently, as shown in FIG. 4E, an etching solution is applied such that all of the metal layer 203 is removed except for the metal layer 203a masked by the $TiO_2$ layer 211 having the hydrophilic characteristic and the first $TiO_2$ layer 210a. Then, as shown in FIG. 4F, the first $TiO_2$ layer 210a is removed by using Cl$_2$/N$_2$ gas or CF$_4$/Cl$_2$ gas so as expose the metal pattern on the substrate 201.

As stated above, in the pattern forming method in accordance with embodiments of the present invention, the pattern is formed by using the etching rate difference between a metal, such as Ti, a metallic oxide and the surface characteristics of a metallic oxide. Typically, the Ti and TiO$_2$ processes are performed in a vacuum chamber, and most processes for semiconductor devices or the display devices are also performed in a vacuum chamber. Therefore, Ti and TiO$_2$ can also be performed in the processing of semiconductor and display devices such that the fabrication process can be simplified and costs can be reduced.

The above-described pattern forming method of the present invention can be adopted for forming various patterns, such as a metal pattern, an insulating pattern, a semiconductor pattern or the like. In addition, such method can be applied to various electronic devices, such as semiconductor device and display devices like a liquid crystal display device. A method for fabricating an electronic device by adopting the pattern forming method in accordance with embodiments of the present invention will now be described. To begin with, a method for fabricating a liquid crystal display device will now be described with reference to FIGS. 6 to 9. The liquid crystal display (LCD) device, such as a transmissive flat panel display device, is widely used in various electronic devices, such as a mobile phone, a PDA or a notebook computer. The LCD is more practical compared to other flat panel display devices because the LCD has the advantages of having a thin profile and light-weight while implementing a high picture quality. With the demand for digital TV, a high picture quality TV and a wall-mounted TV increasing, research in a large scale LCD adoptable to TV use is being more actively conducted. In general, the LCD can be divided into several types depending on the method of operating liquid crystal molecules in the LCD. At present, an active matrix thin film transistor (TFT) LCD is commonly used because of a quick response time and less residual imaging.

Figure 6:
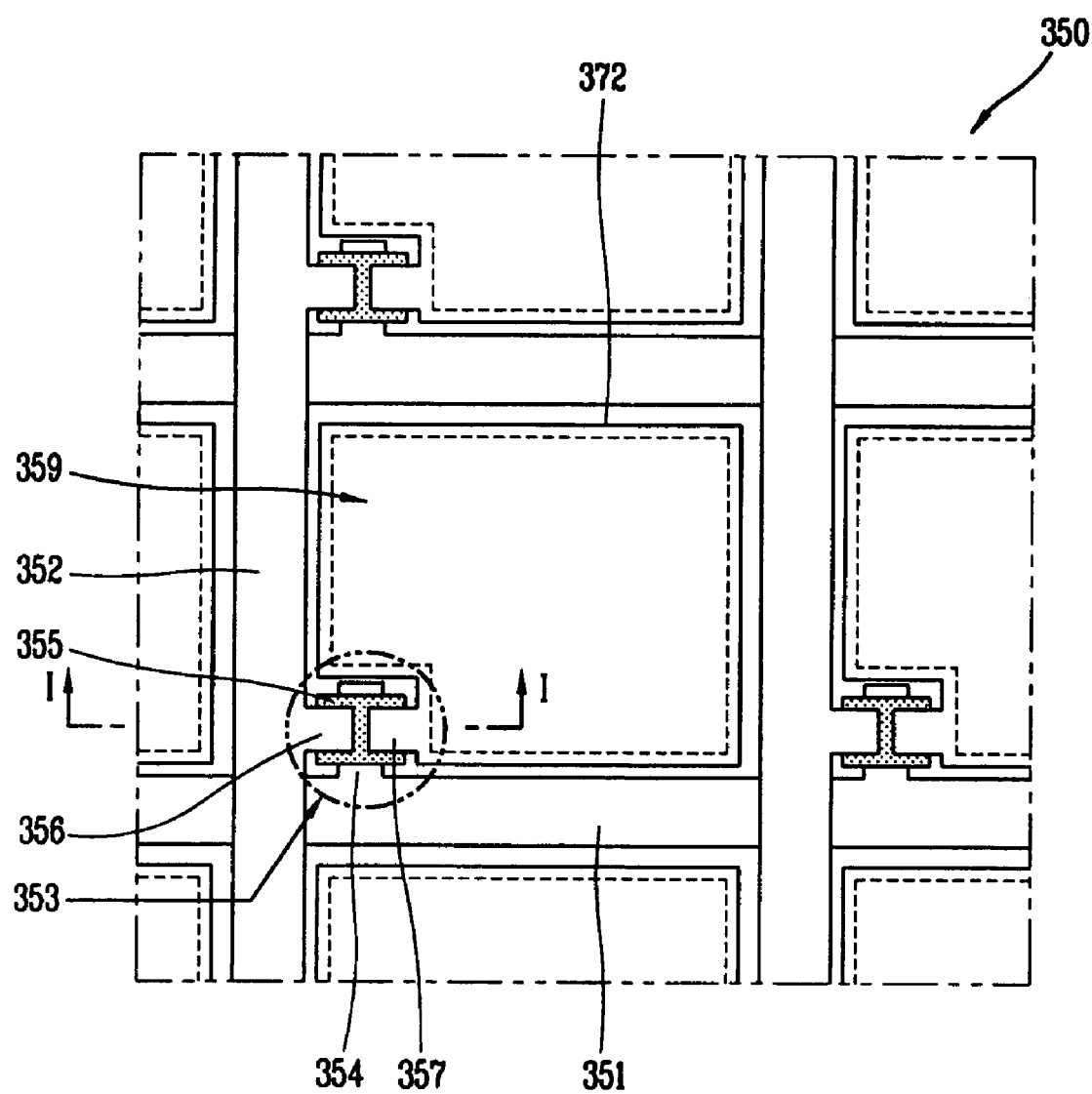
FIG. 6 is a plan view of a liquid crystal display device.

FIG. 6 shows a structure of a panel 350 of the TFT LCD. As shown in FIG. 6, a plurality of gate lines 351 and a plurality of data lines 352 defining a plurality of pixels are formed vertically and horizontally on a liquid crystal display panel 350. In general, N×M pixels are formed by N number of gate lines 351 and M number of data lines 352. For the sake of explanation, only one pixel is shown in the drawings.

As shown in FIG. 6, a thin film transistor 353 is disposed in each pixel, which includes a gate electrode 354 connected to the gate line 351, a semiconductor layer 355 formed on the gate electrode 354 and activated when a scan signal is applied to the gate electrode 354, and a source electrode 356 and a drain electrode 357 formed on the semiconductor layer 355. A pixel electrode 359 is formed in each pixel. The pixel electrode 359 is connected to the drain electrode, so that when the semiconductor layer 355 is activated, an image signal is applied to the pixel electrode 359 through the source electrode 356 and drain electrode 357, thereby operating liquid crystal (not shown). A black matrix 372 is formed over the thin film transistor 353, the gate line 351 and the data line 352 to prevent light leakage and to prevent light from affecting the thin film transistor 353.

Figure 7:
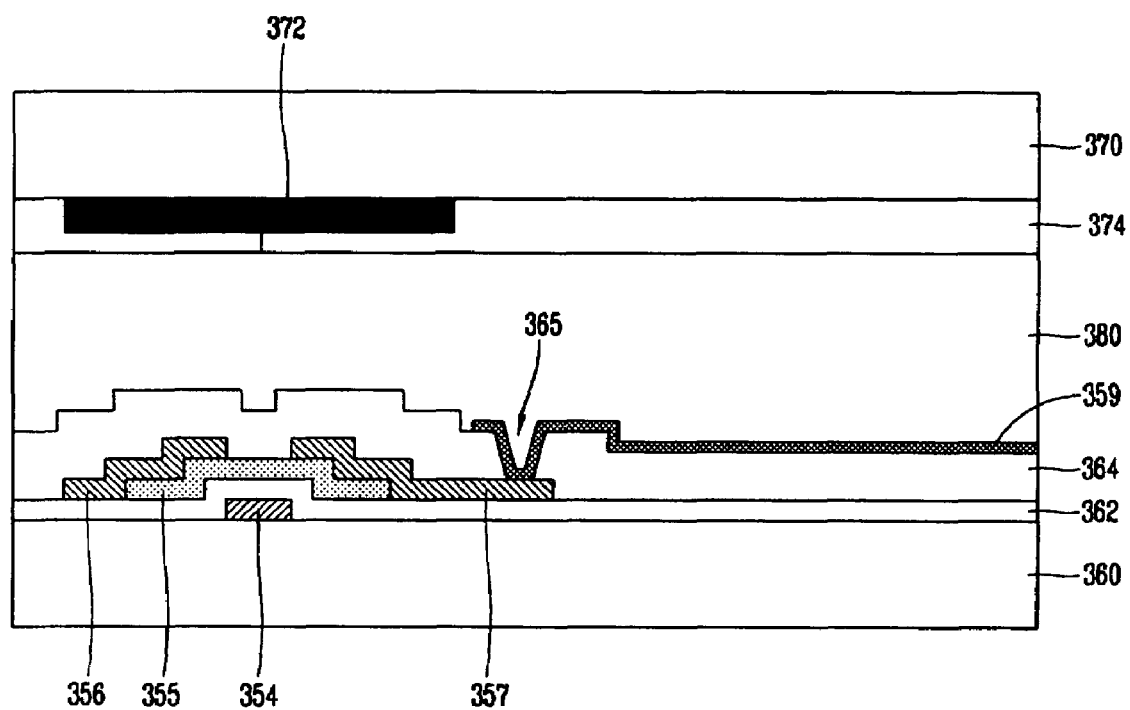
FIG. 7 is a sectional view taken along line I–I' of FIG. 6.

The structure of the liquid crystal display device will now be described with reference to FIG. 7. As shown in FIG. 7, the gate electrode 354 made of a metal is formed on a lower substrate 360 that is made of a transparent insulating material, such as glass. The gate insulating layer is deposited over the entire substrate 360 with the gate electrode 355 formed thereon. The semiconductor layer 355 is formed on the gate insulating layer 362, on which the source electrode 356 and the drain electrode 357 made of metal are formed.

A passivation layer 364 is formed over the lower substrate 360 with the source electrode 356 and the drain electrode 357 formed thereon. On the passivation layer 364, a pixel electrode 359 made of a transparent metal, such as ITO (Indium Tin Oxide), is formed and electrically connected to the drain electrode 357 of the TFT 353 through a contact hole 365 formed in the passivation layer 364. The black matrix 372, a light shielding layer, is formed on an upper substrate 370 to prevent degradation of a picture quality due to light leakage into a non-displaying region of the pixel, that is, between the pixels, and into the TFT region. A color filter layer 374 is formed at an image display region to implement an actual color. Although not shown in the drawings, a common electrode made of a transparent metal, such as ITO, is formed on the color filter layer 374. Formation of a liquid crystal layer 380 between the lower substrate 360, which has the TFT 353 formed thereon, and the upper substrate 370, which has the color filter layer 374 formed thereon, completes a liquid crystal display device.

A masking process having a total of five masking steps can be used to form an LCD device in accordance with embodiments of the present invention that includes a gate electrode 354 forming step, a semiconductor layer 355 forming step, a source electrode 356 and drain electrode 357 forming step, a passivation layer 364 forming step for formation of the contact hole 365 and a pixel electrode 359 forming step. In the case of the related art fabrication method using the photoresist, photoresist processes are performed between the gate metal depositing process and the semiconductor depositing process, between the semiconductor depositing process and the source metal depositing process, between the source metal depositing process and the passivation layer forming process, between the passivation layer forming process and the metal for pixel electrode depositing process, and after the metal for pixel electrode depositing process. Comparatively, in accordance with embodiments of the present invention, the liquid crystal display device is fabricated by using the pattern forming methods as illustrated in FIGS. 2A to 2F and 4A to 4F. That is, in each photolithography process, each pattern is formed by using the etching selection ratio (that is, the etching rate difference) between a metal, such as Ti, a metallic oxide, such as TiOx, or by using the difference in surface characteristics of TiO$_2$.

Figure 8A:
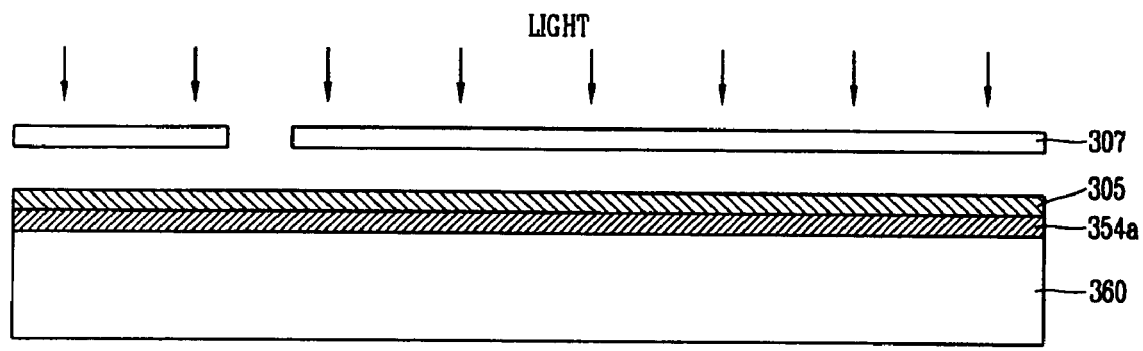
FIGS. 8A to 8G illustrate sequential processes of a method for fabricating a liquid crystal display device using a pattern forming method in accordance with embodiments of the present invention.
Figure 8B:
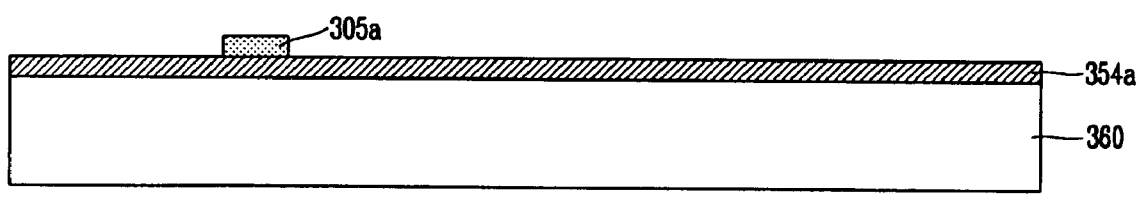

A method for fabricating a liquid crystal display device in accordance with embodiments of the present invention will now be described in detail with reference to FIGS. 8A to 8G, in which Ti is deposited and oxidized to form a pattern. Although not shown in these drawings, the method for fabricating liquid crystal display device can also be adopted for a pattern forming method using the surface characteristics difference of TiO$_2$ layer. First, as shown in FIG. 8A, a metal, such as Al, Al alloy or Cu, is deposited on the lower substrate 360 made of a transparent material, such as glass to form a metal layer 354a, on which a Ti layer 305 is formed. Subsequently, a mask 307 is positioned above the Ti layer 305, and then, light, such as ultraviolet ray or laser, is irradiated onto the Ti layer 305. Then, a region of the Ti layer to which light has been irradiated is oxidized to TiOx. Thereafter, when an etching solution (for example, an acid such as HF) is applied thereto, Ti is removed such that only a TiOx pattern 305a remains on the metal layer 354a, as shown in FIG. 8B. When an etching solution is applied to the metal layer 354a, all of the metal layer 354a is removed except for the portion of the metal layer 354a that is masked by the TiOx pattern 305a. Then, the TiOx pattern 305a is etched such that the gate electrode 354 is formed on the lower substrate 360.

Figure 8C:
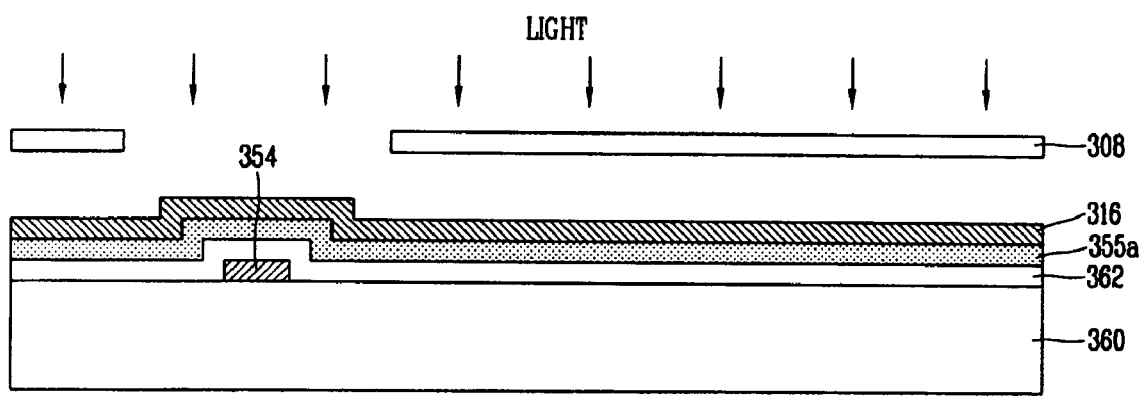

Subsequently, as shown in FIG. 8C, the gate insulating layer 362 is formed on the entire lower substrate 360 through a CVD (Chemical Vapor Deposition) method. A semiconductor layer 355a is deposited on the gate insulating layer 362. Then, another Ti layer 316 is formed on the semiconductor layer 355a. When light, such as an ultraviolet ray or laser, is irradiated onto the Ti layer 316 using a mask 308, a region of the Ti layer 316, which is not blocked with the mask 308, oxidizes to become TiOx.

Figure 8D:
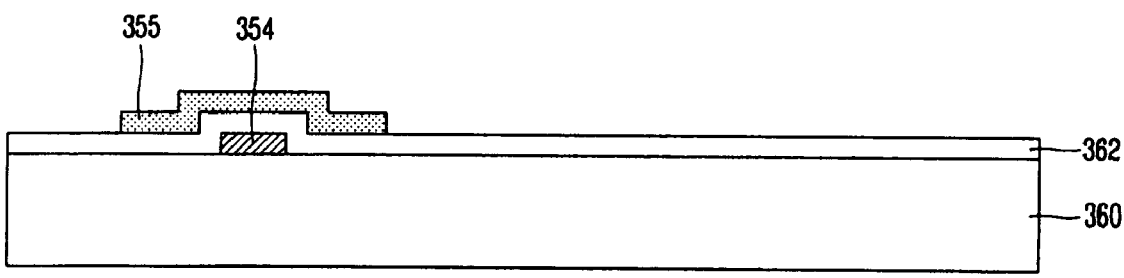

Thereafter, as shown in FIG. 8D, when the etching solution, such as an acid, is applied to the Ti layer 316, a pattern is obtained corresponding to the TiOx of the Ti layer 316. While a portion of the semiconductor layer 355a is masked with the TiOx pattern, the semiconductor layer 355a and the TiOx pattern are etched continuously with an etching gas such that only the semiconductor layer 355 remains on the gate insulating layer 362.

Figure 8E:
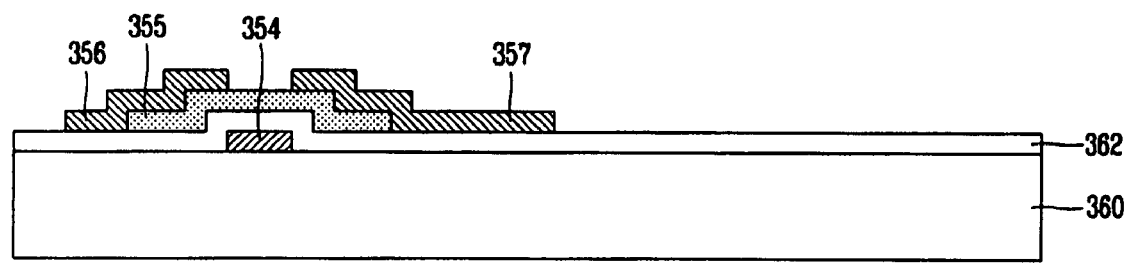

As shown in FIG. 8E, the source electrode 356 and the drain electrode 357 made of a metal, such as Cr, Mo, Al, Al alloy or Cu, are formed on the semiconductor layer 355, thereby completing a TFT. Although not shown in the drawing, the source electrode 356 and the drain electrode 357 may also be formed through the same processes as those used for forming the gate electrode 354. That is, light is irradiated onto a Ti layer to oxidize the Ti layer. The non-oxidized portion of the TI layer is etched to form a TiOx pattern. Then the source electrode 356 and the drain electrode 357 are formed using the TiOx pattern.

Figure 8F:
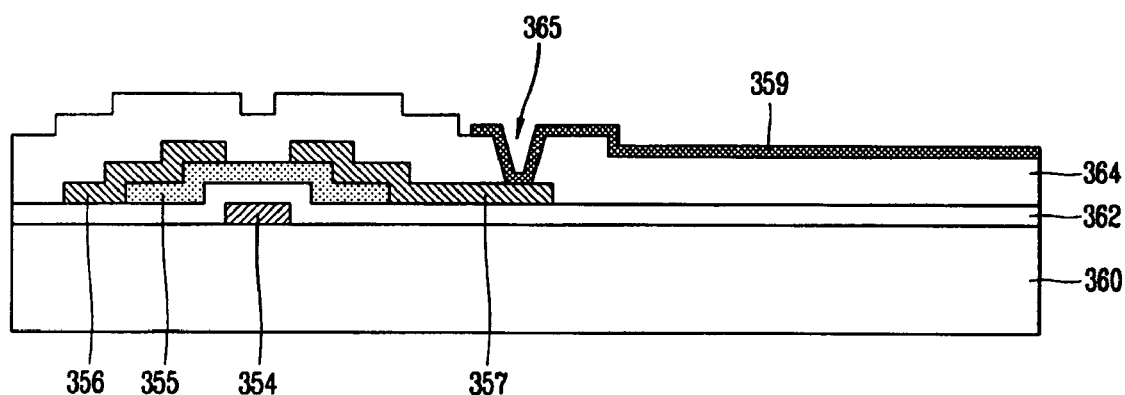

As shown in FIG. 8F, the passivation layer 364 is formed over the lower substrate 360 where the TFT has been formed. Then, a transparent metal, such as ITO, is deposited to form the pixel electrode 359. The pixel electrode 359 is electrically connected to the drain electrode 357 of the TFT through the contact hole 365 formed in the passivation layer 364. Patternings of the contact hole 365 in the passivation layer 364 and the pixel electrode 359 may be made through a photolithography process using Ti.

Figure 8G:
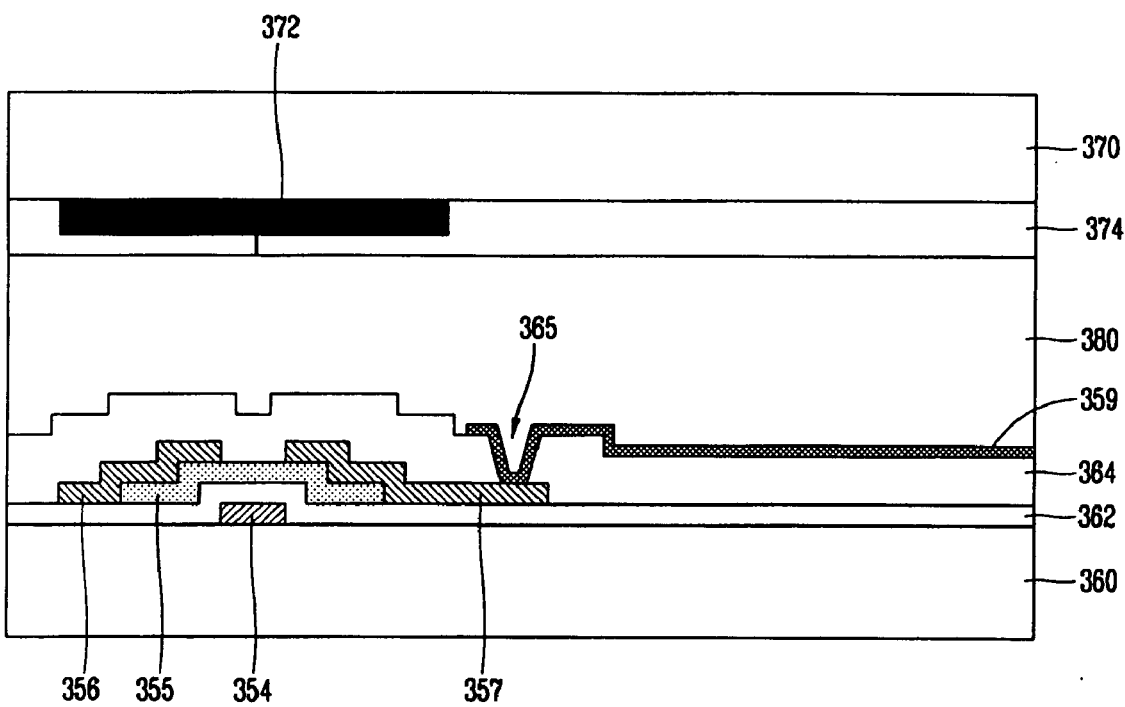

Subsequently, as shown in FIG. 8G, on the upper substrate 370, a black matrix 372 made of Cr/CrOx or a black resin is formed and a color filter layer 374 is formed on the upper substrate 370. The lower substrate 360 and the upper substrate 370 are then attached. A liquid crystal layer 380 is positioned between the lower substrate 360 and the upper substrate 370, thereby completing a liquid crystal display device.

As mentioned above, in accordance with embodiments of the present invention, the liquid crystal display device is fabricated by adopting the pattern forming method using the etching selection ratio between Ti and TiOx. The adoption of such a pattern forming method makes the overall fabrication process of the liquid crystal display device simple and also reduces the fabrication cost. The pattern forming method in accordance with embodiments of the present invention can be also adopted as a method for fabricating a semiconductor device, which will now be described with reference to FIGS. 9A to 9F.

Figure 9A:
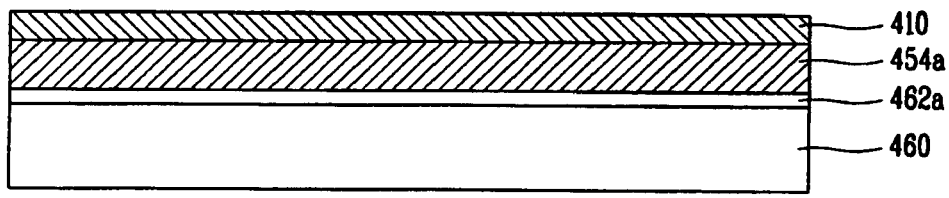
FIGS. 9A to 9F illustrate sequential processes of a method for fabricating a semiconductor device adopting the pattern forming method in accordance with embodiments of the present invention.

FIGS. 9A to 9F illustrating sequential processes of a method for fabricating a semiconductor device adopting the pattern forming method in accordance with the present invention. First, as shown in FIG. 9A, an insulation layer 462a is formed on a semiconductor substrate 460, such as a semiconductor wafer. A semiconductor layer 454a, such as a poly-silicon (p-Si), is formed on the insulation layer 462a. A Ti layer 410 is formed on the insulation layer 462a.

Figure 9B:
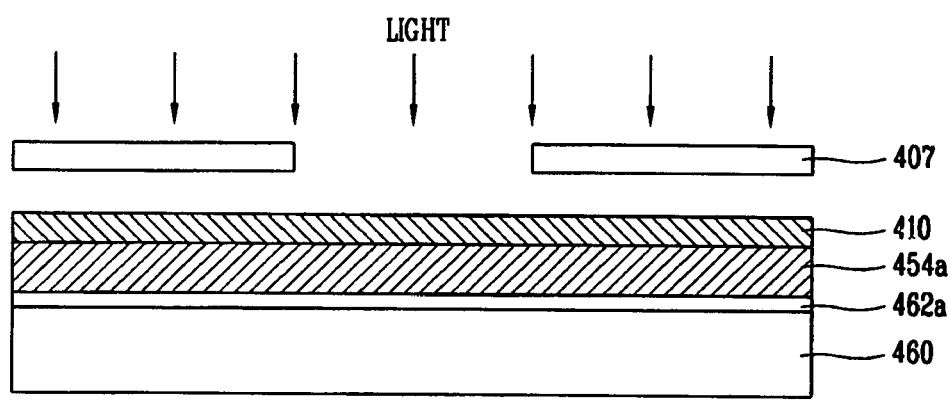
Figure 9C:
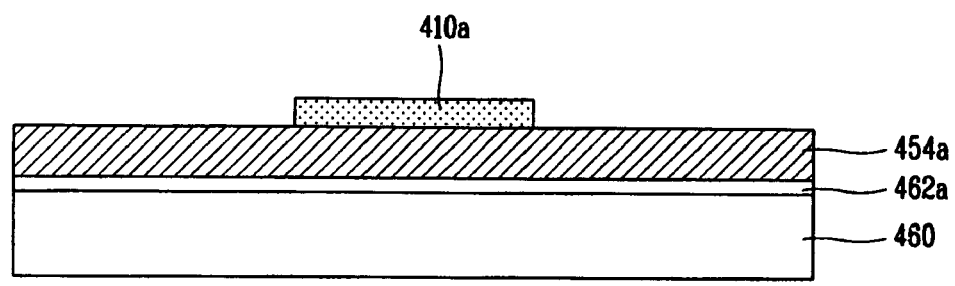
Figure 9D:
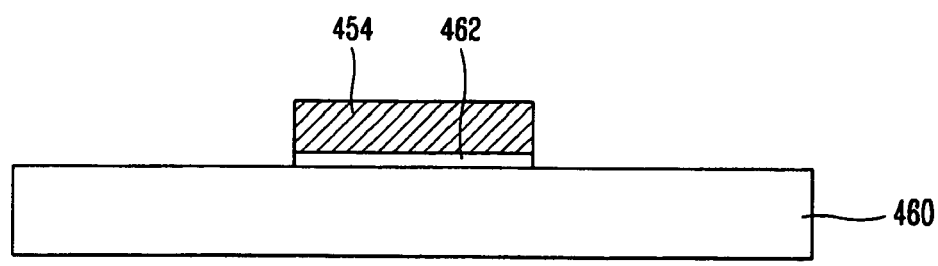
Figure 9E:
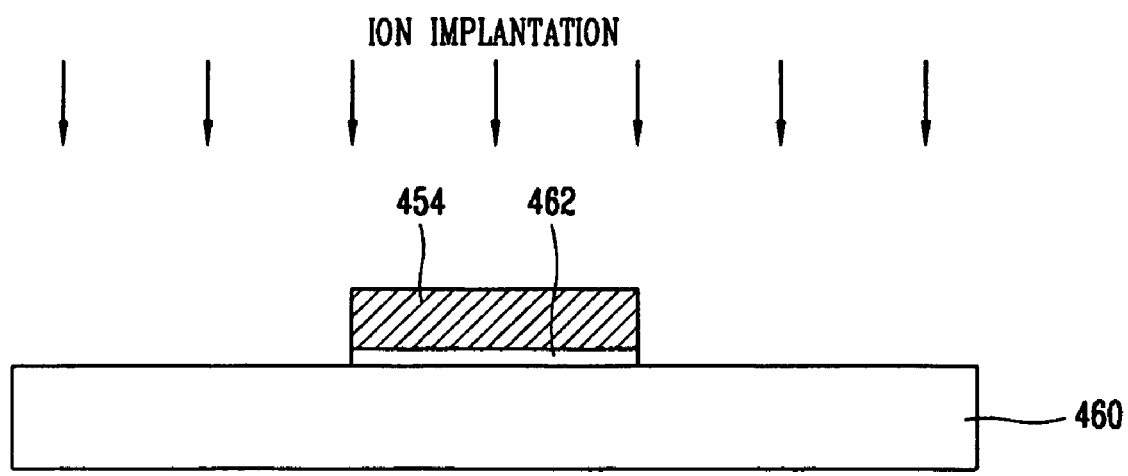
Figure 9F:
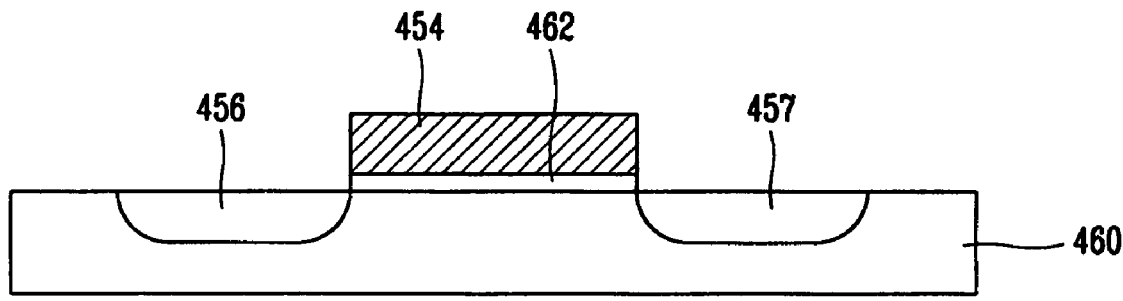

Next, as shown in FIG. 9B, when light, such as ultraviolet ray or laser, is irradiated using a mask 407, the Ti layer 410 irradiated by light is oxidized into TiOx while the rest of the Ti layer 410 remains unchanged. When an etching solution, such as an acid or an etching gas including $Cl_2$ gas or a $Cl_2$-mixed gas like $CF_4/Cl_2/O_2$, is applied to the Ti layer 410, the unchanged portion of Ti layer is removed such that only a TiOx pattern 410a remains on the poly-crystalline semiconductor layer 454a, as shown in FIG. 9C. While the semiconductor layer 454a is masked with the TiOx pattern 410a, the etching solution is applied such that the insulating layer 462a, the poly-crystalline semiconductor layer 454a and the TiOx pattern 410 are removed such that only the gate insulating layer 462 and the gate electrode 454 thereon remain on the semiconductor substrate 460, as shown in FIG. 9D. As shown in FIG. 9E, ions are implanted into the semiconductor substrate 460 while the semiconductor substrate 460 is masked with the gate electrode 454. As result of such an ion implantation, the source region 456 and the drain region 457 are formed in the semiconductor substrate 460, as shown in FIG. 9F, thereby completing a semiconductor device.

The insulating layer 462a and the poly-crystalline semiconductor layer 454a may be simultaneously etched, as described above, or etched separately. If etched separately, the insulating layer 462a can be etched after ion implantation. In this case, the insulating layer 462a serves as a buffer layer for preventing the semiconductor substrate 460 from being affected by the ion implantation.

In the method for fabricating the semiconductor device, light is irradiated onto a Ti layer to oxidize a region thereof into TiOx such that a pattern can be formed from the etching selection ratio between Ti and TiOx. The pattern can be also formed by a surface characteristics difference (hydrophillic and hydrophobic) for $TiO_2$. The pattern forming method of the present invention can be favorably used to form various patterns in different devices, such as liquid crystal display devices or semiconductor devices. Likewise, the pattern forming method in accordance with embodiments of the present invention can be adopted for every electronic device in which either metal or insulating patterns are used.

The pattern forming method in accordance with embodiments of the present invention has many advantages by using the metal, such as Ti, and a metallic oxide, such as TiOx, instead of using the photoresist as in the related art. First, the fabrication process is simple in that a two-step photoresist baking is not required. Second, the fabrication cost is reduced because a separate development line is not required for a patterning process. The pattern forming process in accordance with embodiments of the present invention can be performed in the same equipment that is used to form an electronic device. For example, in the case of forming a pattern for a metal layer, the metal layer and the Ti layer are formed in the same vacuum chamber. Accordingly, compared to the related art pattern forming method using photoresist, the fabrication cost can be remarkably reduced. In the case of fabricating the TFT by using the pattern forming method in accordance with the embodiments of the present invention, the cost is about 15~20% of the total fabrication cost of the TFT. This rate is much less than the rate of 40~45% of the related art pattern forming method using the photoresist. Third, the environmental pollution problem can be effectively handled since the present invention does not discard any photoresist. Finally, a defective electronic device can be prevented. Unlike the deposition of photoresist, Ti is deposited by evaporation or sputtering, so that thickness can be accurately controlled such that the occurrence of pattern deficiency can be prevented.

As the present invention may be embodied in several forms without departing from the spirit or essential characteristics thereof, it should also be understood that the above-described embodiments are not limited by any of the details of the foregoing descriptions, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A pattern forming method comprising:
forming an etching-subject layer on a substrate;
forming a Ti layer on the etching-subject layer;
forming a TiOx layer by irradiating light on a portion of the Ti layer using a mask;
etching the Ti layer to remove remaining Ti metal portions of the Ti layer to form a TiOx pattern;
etching the etching-subject layer using the TiOx pattern as a mask; and
removing the TiOx pattern.

2. The method of claim 1, wherein the light is an ultraviolet ray or laser.

3. The method of claim 1, wherein the Ti layer is oxidized by the irradiation of the light to form the TiOx layer.

4. The method of claim 1, wherein etching the Ti layer includes applying an etching solution having an acid.

5. The method of claim 4, wherein the acid includes HF.

6. The method of claim 1, wherein etching the Ti layer includes the applying an etching gas containing $Cl_2$.

7. The method of claim 1, wherein etching the Ti layer includes applying the etching gas includes a $Cl_2$-mixed gas.

8. The method of claim 7, wherein the $Cl_2$-mixed gas includes $CF_4/Cl_2/O_2$ gas.

9. The method of claim 1, wherein removing the TiOx pattern includes applying an etching solution having $H_2SO_4$.

10. The method of claim 1, wherein removing the TiOx pattern includes applying an alkali based etching solution.

11. The method of claim 1, wherein removing the TiOx pattern includes applying the etching gas including $Cl_2/N_2$ gas.

12. The method of claim 1, wherein removing the TiOx pattern includes applying the etching gas including $CF_4/Cl_2$.

13. The method of claim 1, wherein the etching-subject layer is one of a metal layer, an insulating layer and a semiconductor layer.

14. The method of claim 1, wherein the Ti layer is formed with the same equipment as the etching-subject layer.

15. A pattern forming method comprising:
forming an etching-subject layer on a substrate;
forming a Ti layer on the etching-subject layer;
oxidizing a portion of the Ti layer to form TiOx portions;
removing remaining Ti metal portions of the Ti layer to form a TiOx pattern;
etching the etching-subject layer using the TiOx pattern as a mask; and
removing the TiOx pattern.

16. The method of claim 15, wherein oxidizing a portion of the Ti layer includes irradiating light onto the Ti layer using a mask.

17. The method of claim 16, wherein the light is one of ultraviolet light and laser.

18. A pattern forming method comprising:
forming an etching-subject layer on a substrate;
forming a $TiO_2$ layer including a first region and a second region on the etching-subject layer;
irradiating light onto the first region of the $TiO_2$ layer using a mask;
etching the second region of the $TiO_2$ layer;
etching the etching-subject layer using the first region of the $TiO_2$ layer as a mask; and
removing the first region of the $TiO_2$ layer.

19. The method of claim 18, wherein forming the $TiO_2$ layer includes depositing $TiO_2$ on the etching-subject layer.

20. The method of claim 18, wherein forming the $TiO_2$ layer includes:
depositing Ti on the etching-subject layer to form a Ti layer; and
oxidizing the Ti layer.

21. The method of claim 20, wherein the Ti layer is oxidized by irradiation of light.

22. The method of claim 18, wherein the light is ultraviolet light or laser.

23. The method of claim 18, wherein a surface of the first region of the $TiO_2$ layer is changed from hydrophobic to hydrophilic by the irradiation of the light.

24. The method of claim 18, wherein etching the second region of $TiO_2$ layer includes applying an etching solution including $H_2SO_4$ to the $TiO_2$ layer.

25. The method of claim 18, wherein etching the second region of $TiO_2$ layer includes applying an alkali based etching solution to the $TiO_2$ layer.

26. The method of claim 18, wherein removing the first region of $TiO_2$ layer includes applying an etching gas having $Cl_2/N_2$ gas to the first region of the $TiO_2$ layer.

27. The method of claim 18, wherein removing the first region of $TiO_2$ layer includes applying the etching gas having $CF_4/Cl_2$ gas to the first region of $TiO_2$ layer.

28. The method of claim 18, wherein the etching-subject layer includes one of a metal layer, an insulating layer and a semiconductor layer.

29. The method of claim 18, wherein the $TiO_2$ layer is formed using the same equipment used for forming the etching-subject layer.

30. A pattern forming method comprising:
forming an etching-subject layer on a substrate;
forming a $TiO_x$ layer on the etching-subject layer;
changing a surface of the $TiO_x$ layer from hydrophobic to hydrophilic such that the $TiO_x$ layer has a hydrophobic surface and a hydrophilic surface;
etching a portion of $TiO_x$ layer having a hydrophobic surface to form a hydrophilic $TiO_x$ pattern;
etching the etching-subject layer using the hydrophilic $TiO_x$ pattern as a mask; and
removing the hydrophilic $TiO_x$ pattern.

31. The method of claim 30, wherein changing a surface of the $TiO_x$ layer includes irradiating light onto the $TiO_x$ layer.

32. The method of claim 31, wherein the light includes one of ultraviolet and laser.

33. A pattern forming method comprising:
providing an etching-subject layer;
forming a metal layer on the etching-subject layer;
oxidizing a portion of the metal layer to form a metallic oxide layer portion and non-oxidized metal layer portion;
removing the non-oxidized metal layer portion using a first etching means;

etching the etching-subject layer using the metallic oxide layer as a mask; and etching the metallic oxide layer using a second etching means.

34. The method of claim 33, wherein the metal layer includes a Ti.

35. The method of claim 34, wherein the metallic oxide layer portion includes TiOx.

36. The method of claim 33, wherein the first etching means is an etching solution having a higher etching rate on the non-oxidized metal layer portion than on the metallic oxide layer portion.

37. The method of claim 33, wherein the first etching means is an etching gas having a higher etching rate on the non-oxidized metal layer portion than on the metallic oxide layer portion.

38. The method of claim 33, wherein the second etching means is an etching solution having a higher etching rate on the metallic oxide layer portion than on the non-oxidized metal layer portion.

39. The method of claim 33, wherein the second etching means is an etching gas having a higher etching rate on the metallic oxide layer portion than on the non-oxidized metal layer portion.

40. A method for fabricating a liquid crystal display device, the method comprising:

providing a substrate;

forming a gate electrode on the substrate using a first metal masking layer;

depositing a gate insulating layer over the substrate;

forming a semiconductor layer on the gate insulating layer using a second metal masking layer;

forming source/drain electrodes on the semiconductor layer using a third metal masking layer;

forming a passivation layer over the substrate; and depositing a pixel electrode on the passivation layer.

41. The method of claim 40, wherein the first, second and third metal masking layers are each comprised of Ti.

42. The method of claim 41, wherein forming the gate electrode includes the steps of:

forming a metal layer on the substrate;

forming the first metal masking layer made of Ti on the metal layer;

irradiating light onto a portion of the first metal masking layer using a mask to form a TiOx masking layer portion and a Ti masking layer portion;

etching the Ti masking layer portion;

etching the metal layer using the TiOx masking layer portion as a mask; and removing the TiOx masking layer portion.

43. The method of claim 41, wherein forming the semiconductor layer includes:

depositing the semiconductor layer on the gate insulating layer;

forming the second metal masking layer made of Ti on the semiconductor layer;

irradiating light onto a portion of the second metal masking layer using a mask to form a TiOx masking layer portion and a Ti masking layer portion;

etching the Ti masking layer portion;

etching the semiconductor layer using the TiOx masking layer portion as a mask; and removing the TiOx masking layer portion.

44. The method of claim 41, wherein forming the source/drain electrode includes:

forming a metal layer on the semiconductor layer;

forming the third metal masking layer made of Ti on the metal layer;

irradiating light to a portion of the metal masking layer using a mask to form a TiOx masking layer portion and a Ti masking layer portion;

etching the Ti masking layer portion;

etching the metal layer using the TiOx masking layer portion as a mask; and removing the TiOx masking layer portion.

45. The method of claim 40, wherein depositing the pixel electrode includes:

forming an Indium Tin Oxide layer on the passivation layer;

forming a fourth metal masking layer made of Ti on the Indium Tin Oxide layer;

irradiating light to a portion of the metal masking layer by using a mask to form a TiOx masking layer portion and a Ti masking layer portion;

etching the Ti masking layer portion;

etching the Indium Tin Oxide layer using the TiOx masking layer portion as a mask; and removing the TiOx masking layer portion.

46. The method of claim 40, wherein the first, second and third metal masking layers are each comprised of $TiO_2$.

47. The method of claim 46, wherein forming the gate electrode includes:

forming a metal layer on the substrate;

forming the first metal masking layer made of $TiO_2$ on the metal layer;

irradiating light onto a portion of the $TiO_2$ layer to change a surface of the $TiO_2$ layer from hydrophobic to hydrophilic such that the $TiO_2$ layer has a hydrophobic surface and a hydrophilic surface;

etching a portion of $TiO_2$ layer having a hydrophobic surface to form a hydrophilic $TiO_2$ pattern;

etching the metal layer using the hydrophilic $TiO_2$ pattern as a mask; and removing the hydrophilic $TiO_2$ pattern.

48. The method of claim 46, wherein forming the semiconductor layer includes:

depositing the semiconductor layer on the insulating layer;

forming the metal masking layer made of $TiO_2$ on the semiconductor layer;

irradiating light onto a portion of the $TiO_2$ layer to change a surface of the $TiO_2$ layer from hydrophobic to hydrophilic such that the $TiO_2$ layer has a hydrophobic surface and a hydrophilic surface;

etching a portion of $TiO_2$ layer having a hydrophobic surface to form a hydrophilic $TiO_2$ pattern;

etching the semiconductor layer using the hydrophilic $TiO_2$ pattern as a mask; and removing the hydrophilic $TiO_2$ pattern.

49. The method of claim 46, wherein forming the source/drain electrodes includes:

forming a metal layer on the semiconductor layer;

forming the metal making layer made of $TiO_2$ on the metal layer;

irradiating light onto a portion of the $TiO_2$ layer to change a surface of the $TiO_2$ layer from hydrophobic to hydrophilic such that the $TiO_2$ layer has a hydrophobic surface and a hydrophilic surface;

etching a portion of $TiO_2$ layer having a hydrophobic surface to form a hydrophilic $TiO_2$ pattern;

etching the metal layer using the hydrophilic $TiO_2$ pattern as a mask; and removing the hydrophilic $TiO_2$ pattern.

50. The method of claim 46, wherein depositing the pixel electrode includes:
   forming an indium tin oxide layer on the passivation layer;
   forming the fourth metal making layer made of $TiO_2$ on the ITO layer;
   irradiating light onto a portion of the $TiO_2$ layer to change a surface of the $TiO_2$ layer from hydrophobic to hydrophilic such that the $TiO_2$ layer has a hydrophobic surface and a hydrophilic surface;
   etching a portion of $TiO_2$ layer having a hydrophobic surface to form a hydrophilic $TiO_2$ pattern;
   etching the Indium Tin Oxide layer using the hydrophilic $TiO_2$ pattern as a mask; and
   removing the hydrophilic $TiO_2$ pattern.

51. A method for fabricating a semiconductor device, the method comprising:
   depositing an insulating layer on a semiconductor substrate;
   forming a metal layer on the insulating layer;
   forming a Ti layer on the metal layer;
   irradiating light onto a portion of the Ti layer using a mask to form a TiOx masking layer portion and a Ti masking layer portion;
   etching the Ti layer to remove the Ti masking layer portion to form a TiOx pattern as a mask;
   etching the metal layer using the TiOx pattern and removing the TiOx pattern to form a gate electrode; and
   introducing ions to the semiconductor substrate to form source/drain regions.

52. The method of claim 51, wherein the ions are introduced through the insulating layer.

53. The method of claim 51, wherein etching the metal layer includes simultaneously etching of the insulating layer together with metal layer.

54. The method of claim 53, wherein the ions are introduced directly into the semiconductor substrate.

55. A method for fabricating a semiconductor device, the method comprising:
   depositing an insulating layer on a semiconductor substrate;
   forming a metal layer on the insulating layer;
   forming a $TiO_2$ layer on the metal layer;
   irradiating light onto a portion of the $TiO_2$ layer to change a surface of the $TiO_2$ layer from hydrophobic to hydrophilic such that the $TiO_2$ layer has a hydrophobic surface and a hydrophilic surface;
   etching a portion of $TiO_2$ layer having a hydrophobic surface to form a hydrophilic $TiO_2$ pattern;
   etching the metal layer using the hydrophilic $TiO_2$ pattern as a mask to form a gate electrode; and
   introducing ions to the semiconductor substrate to form source/drain regions.

* * * * *